(12) United States Patent
Wei

(10) Patent No.: US 9,482,383 B1
(45) Date of Patent: Nov. 1, 2016

(54) SUPPORT STAND

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Sheng Wei, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/812,037

(22) Filed: Jul. 29, 2015

(30) Foreign Application Priority Data

May 15, 2015 (CN) .......................... 2015 1 0247486

(51) Int. Cl.
| | | |
|---|---|---|
| F16M 11/10 | (2006.01) | |
| A47B 23/04 | (2006.01) | |
| H05K 5/02 | (2006.01) | |
| F16M 13/00 | (2006.01) | |

(52) U.S. Cl.
CPC ............ *F16M 11/10* (2013.01); *A47B 23/043* (2013.01); *F16M 13/00* (2013.01); *H05K 5/0204* (2013.01); *A47B 2023/049* (2013.01)

(58) Field of Classification Search
CPC ................. F16M 11/10; F16M 13/00; A47B 2023/049; H05K 5/0204
See application file for complete search history.

(56) References Cited

U.S. PATENT DOCUMENTS

| | | | | |
|---|---|---|---|---|
| 5,582,373 A | * | 12/1996 | Baudot ................. | F16M 13/00 248/166 |
| 6,807,050 B1 | * | 10/2004 | Whitehorn ............ | G06F 1/1632 361/679.23 |
| 7,106,578 B2 | * | 9/2006 | Chen ..................... | G06F 1/1601 248/917 |
| 7,450,372 B2 | * | 11/2008 | Lin ....................... | G06F 1/1626 361/679.55 |
| 7,492,581 B2 | * | 2/2009 | Kuo ..................... | E05B 17/2038 16/334 |
| 7,702,297 B2 | * | 4/2010 | Wu ..................... | H04M 1/0202 379/433.09 |
| 8,023,283 B2 | * | 9/2011 | Cheng ................... | F16M 13/00 361/801 |
| 8,072,744 B2 | * | 12/2011 | Wang ................... | G06F 1/1616 248/371 |

(Continued)

*Primary Examiner* — Eret McNichols
(74) *Attorney, Agent, or Firm* — Zhigang Ma

(57) ABSTRACT

A support stand includes a housing, a first limiting member, a linkage bar, a first elastic positioning device, and a first supporting arm. The housing defines a receiving groove and a first hollow portion. The receiving groove is configured to receive an electronic device. The first limiting member is fixed in the first hollow portion. The first limiting member defines a first limiting groove. The linkage bar and the first elastic positioning device are movably received in the first hollow portion. The first elastic positioning device is configured to partially limit the first limiting groove, thus the linkage bar is fixed to the housing. The first supporting arm is slidably and rotatably connected to the linkage bar. The first supporting arm is configured to form a desired angle with the housing, whereby the first supporting arm cooperates with the housing to support the housing and the electronic device.

17 Claims, 6 Drawing Sheets

(56) References Cited

U.S. PATENT DOCUMENTS

| | | | | |
|---|---|---|---|---|
| 8,128,054 B2* | 3/2012 | Li | G06F 1/166 | 248/163.1 |
| 8,152,113 B2* | 4/2012 | Chen | F16M 11/10 | 16/319 |
| 8,262,053 B1* | 9/2012 | Zhao | F16M 11/041 | 16/354 |
| 8,274,784 B2* | 9/2012 | Franz | F16M 11/10 | 248/634 |
| 8,472,187 B2* | 6/2013 | Sakamoto | H05K 5/00 | 248/917 |
| 8,763,974 B2* | 7/2014 | Hsu | F16M 11/10 | 248/371 |
| 8,922,995 B2* | 12/2014 | Su | F16M 11/10 | 248/917 |
| 8,998,161 B2* | 4/2015 | Larson | F16M 11/10 | 248/441.1 |
| 9,010,822 B2* | 4/2015 | Rasmussen | F16M 11/10 | 248/919 |
| 9,013,865 B2* | 4/2015 | Chen | H05K 5/0217 | 361/679.21 |
| 9,030,813 B2* | 5/2015 | Chang | G06F 1/1633 | 361/679.27 |
| 9,223,347 B2* | 12/2015 | Hsu | G06F 1/1637 | |
| 2006/0049327 A1* | 3/2006 | Chen | F16M 11/00 | 248/371 |
| 2006/0050471 A1* | 3/2006 | Chen | G06F 1/1601 | 361/679.22 |
| 2006/0077623 A1* | 4/2006 | Yeh | G06F 1/1601 | 361/679.22 |
| 2007/0040079 A1* | 2/2007 | Liang | F16M 11/00 | 248/146 |
| 2007/0075201 A1* | 4/2007 | Shi | G06F 1/1616 | 248/288.11 |
| 2009/0140119 A1* | 6/2009 | To | A47B 23/044 | 248/455 |
| 2010/0243850 A1* | 9/2010 | Derry | F16M 11/10 | 248/372.1 |
| 2011/0260014 A1* | 10/2011 | Chen | F16M 11/10 | 248/157 |
| 2012/0018324 A1* | 1/2012 | Hale | F16M 11/041 | 206/320 |
| 2012/0170212 A1* | 7/2012 | Gallouzi | F16M 11/041 | 316/679.56 |
| 2012/0223194 A1* | 9/2012 | Huang | F16M 11/10 | 248/176.1 |
| 2012/0293931 A1* | 11/2012 | Liu | A47B 23/043 | 361/679.02 |
| 2012/0326003 A1* | 12/2012 | Solow | F16M 11/041 | 248/688 |
| 2013/0001378 A1* | 1/2013 | Chen | F16M 13/005 | 248/121 |
| 2013/0001382 A1* | 1/2013 | Jang | A45F 5/10 | 248/176.1 |
| 2013/0163197 A1* | 6/2013 | Mack | F16M 11/00 | 361/679.56 |
| 2013/0299663 A1* | 11/2013 | Pan | F16M 11/10 | 248/371 |
| 2015/0151690 A1* | 6/2015 | Mannarino | F16M 11/041 | 224/483 |
| 2015/0189771 A1* | 7/2015 | Krohn | G06F 1/1632 | 248/451 |
| 2015/0250064 A1* | 9/2015 | Lee | F16M 11/10 | 248/372.1 |
| 2016/0069508 A1* | 3/2016 | Haymond | F16M 11/38 | 29/857 |
| 2016/0081208 A1* | 3/2016 | Dai | H05K 5/0204 | 361/679.01 |

* cited by examiner

SUPPORT STAND

CROSS-REFERENCE TO RELATED APPLICATIONS

This application claims priority to Chinese Patent Application No. 201510247486.3 filed on May 15, 2015, the contents of which are incorporated by reference herein.

FIELD

The subject matter herein generally relates to support stand for an electronic device.

BACKGROUND

Electronic devices can be configured to be lightweight thin, and without accessories manufacturers have devised stands to support the electronic devices. For example, a tablet is often not able to stand up right without external support. Stands are made to hold the electronic devices in a somewhat upright configuration.

BRIEF DESCRIPTION OF THE DRAWINGS

Implementations of the present technology will now be described, by way of example only, with reference to the attached figures, wherein.

DETAILED DESCRIPTION

Figure 1:
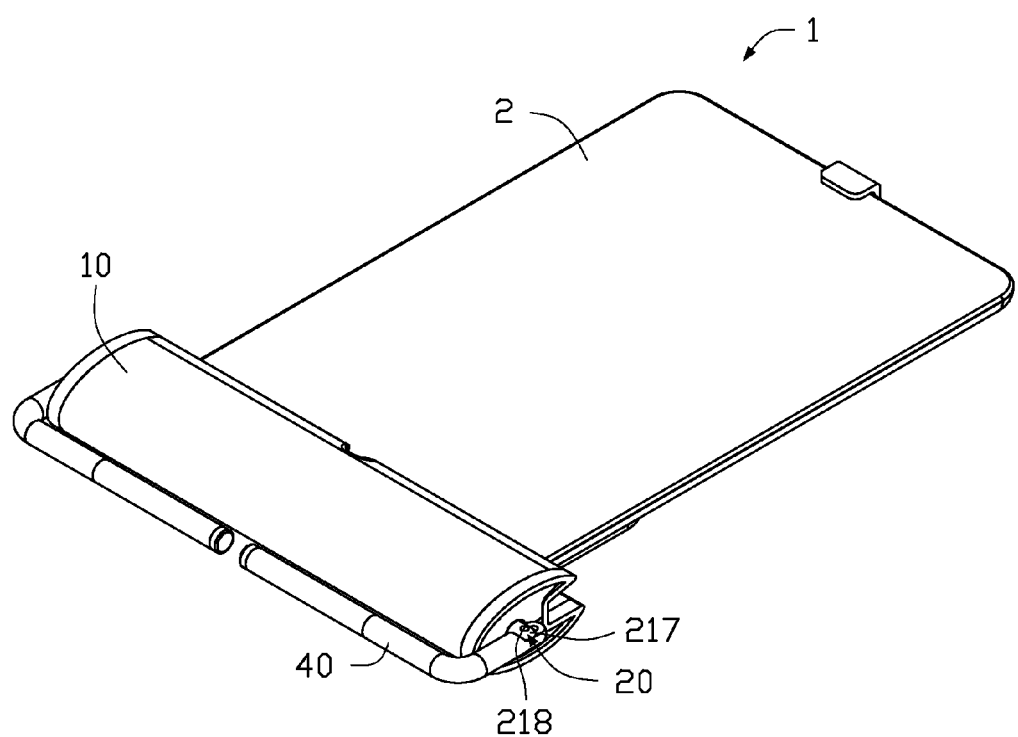
FIG. 1 is an isometric view showing an embodiment of a support stand in a folded state and an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

In general, the term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

Embodiments of the present disclosure will be described with reference to the accompanying drawings.

Figure 2:
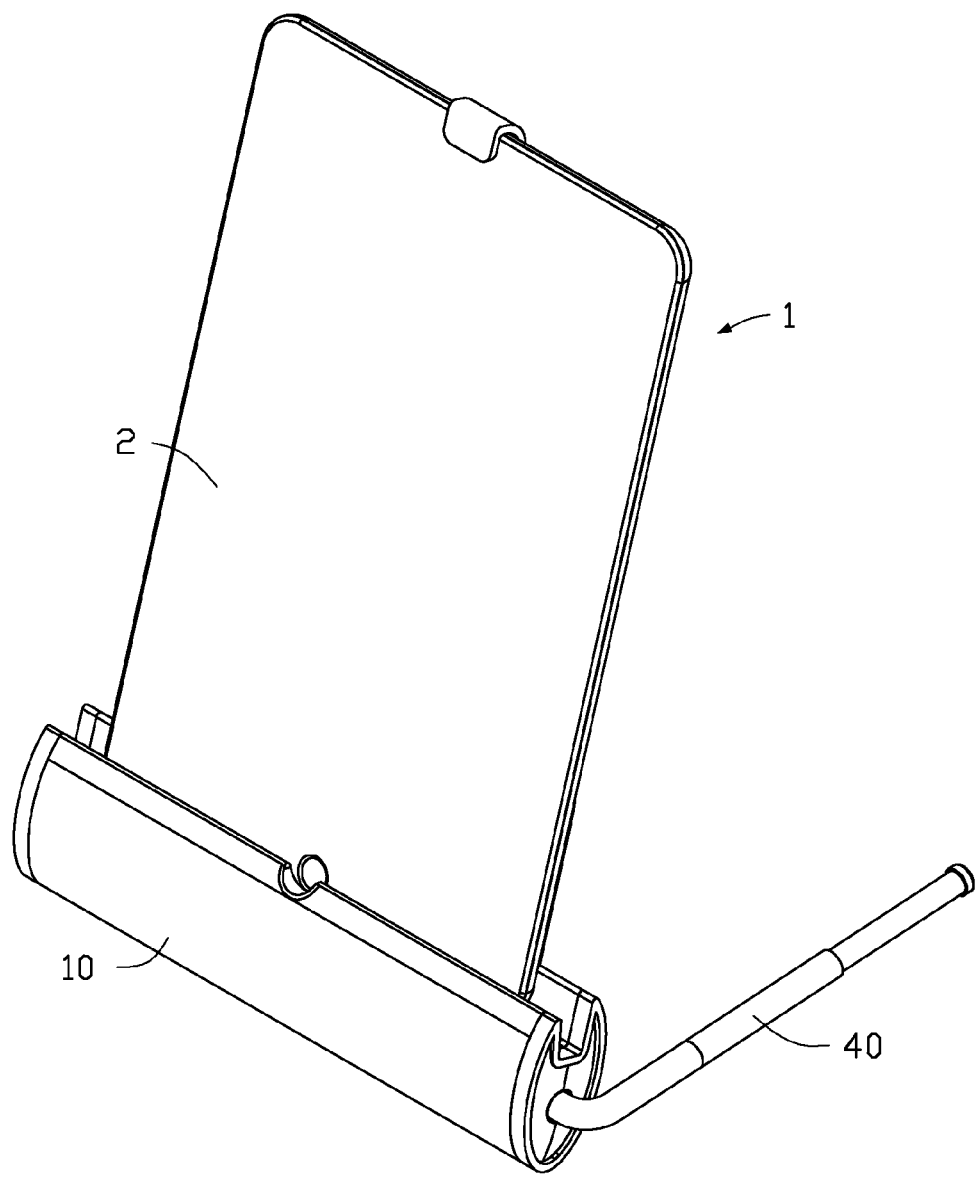
FIG. 2 is similar to FIG. 1, but showing the support stand in an open state and supporting the electronic device.
Figure 6:
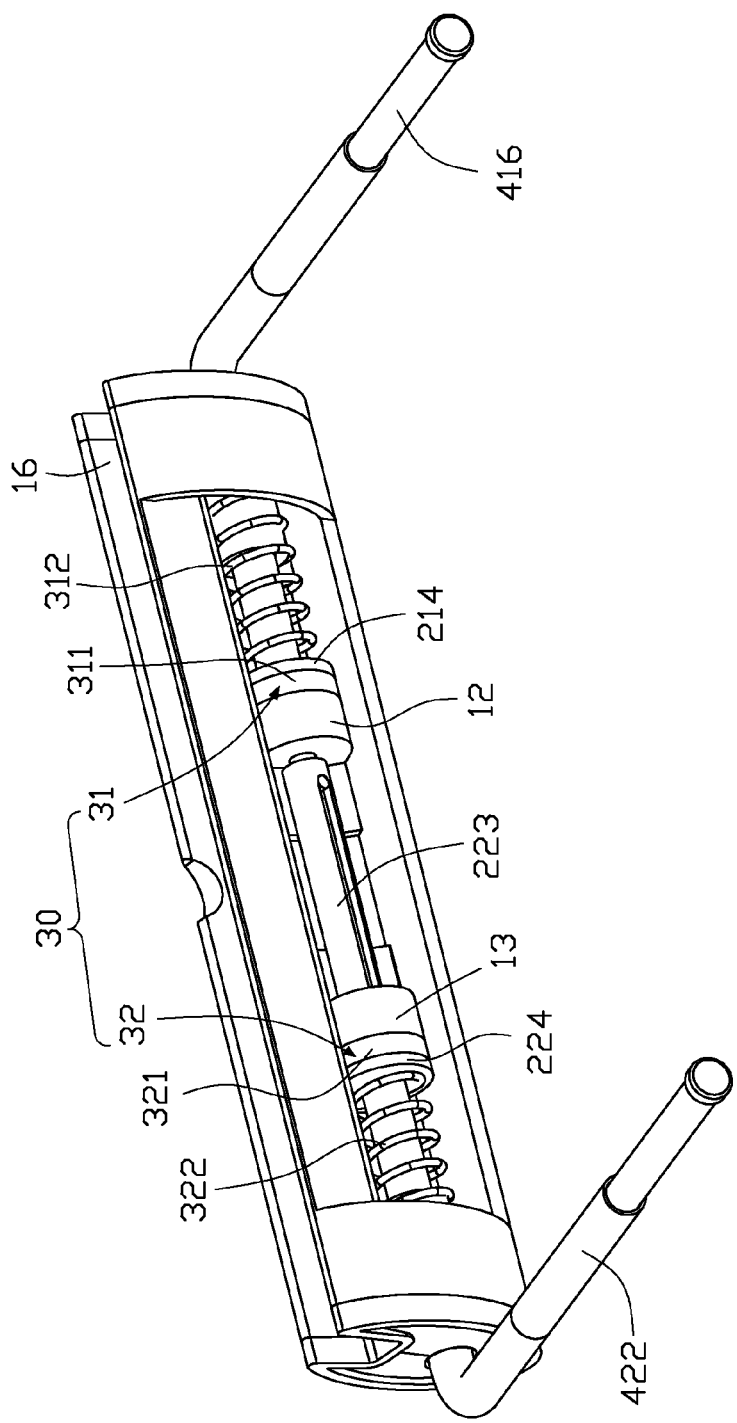
FIG. 6 is an isometric view of the support stand of FIG. 2 omitting the supporting plate and the latching device.

FIGS. 1-2 illustrate an isometric view of an embodiment of a support stand and an electronic device. The support stand 1 can include a base 10, a linkage bar 20, a positioning device 30 (see FIG. 6), and a supporting device 40. The base 10 can receive the electronic device 2. In at least one example, the electronic device 2 can be a smart mobile phone, a tablet style personal computer (tablet PC), a laptop computer, a personal stereo, and the like. The linkage bar 20 can be movably arranged in the base 10. The positioning device 30 can be movably arranged in the base 10 and be configured to fix the linkage bar 20 to the base 10. The supporting device 40 can be movably and rotatably connected to the linkage bar 20. The supporting device 40 can be configured to be positioned relative to the base 10 when the linkage bar 20 is fixed to the base 10, and configured to form a desired angle with the base 10 to support the base 10 and the electronic device 2.

Figure 3:
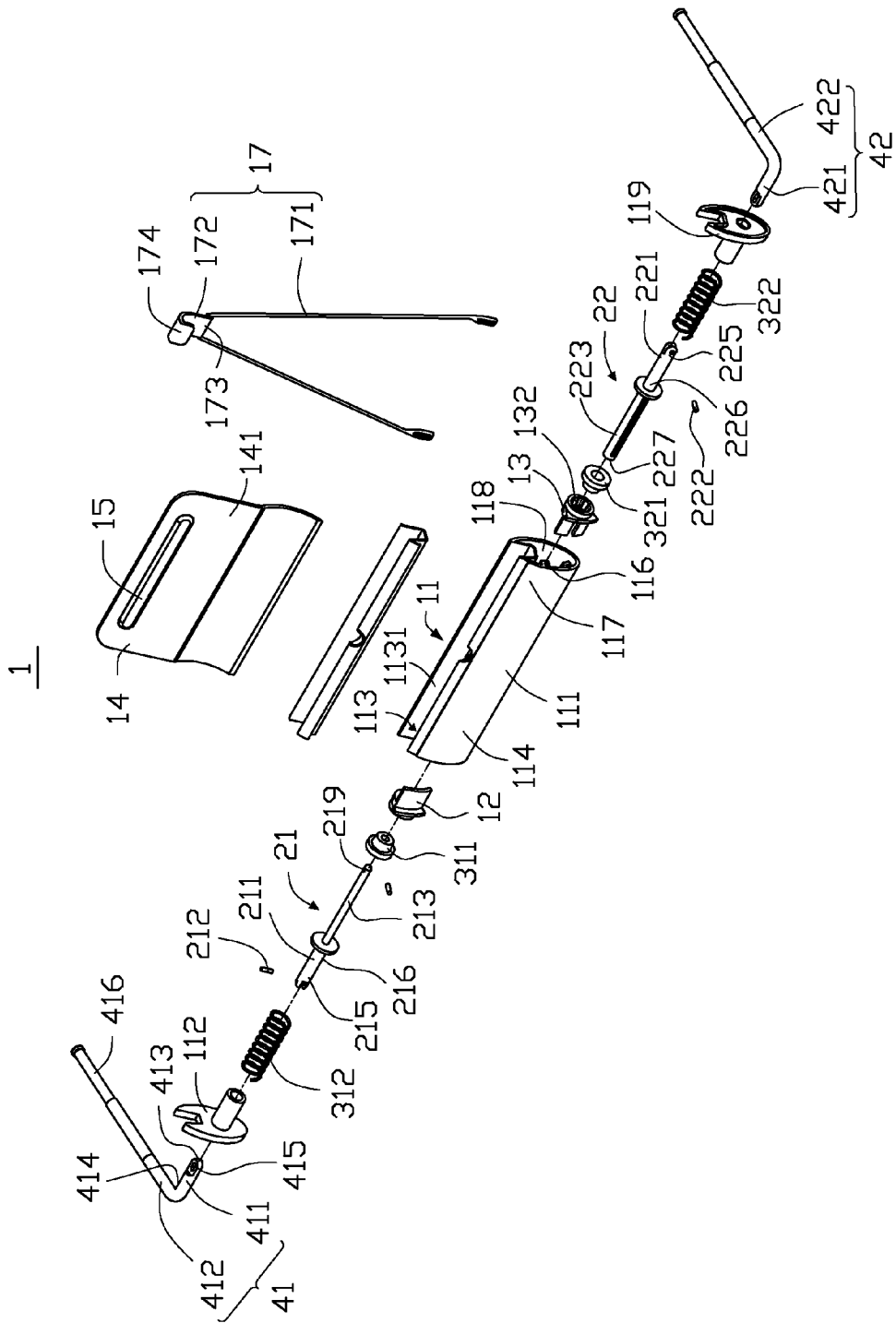
FIG. 3 illustrates an exploded, isometric view showing the support stand of FIG. 2.
Figure 4:
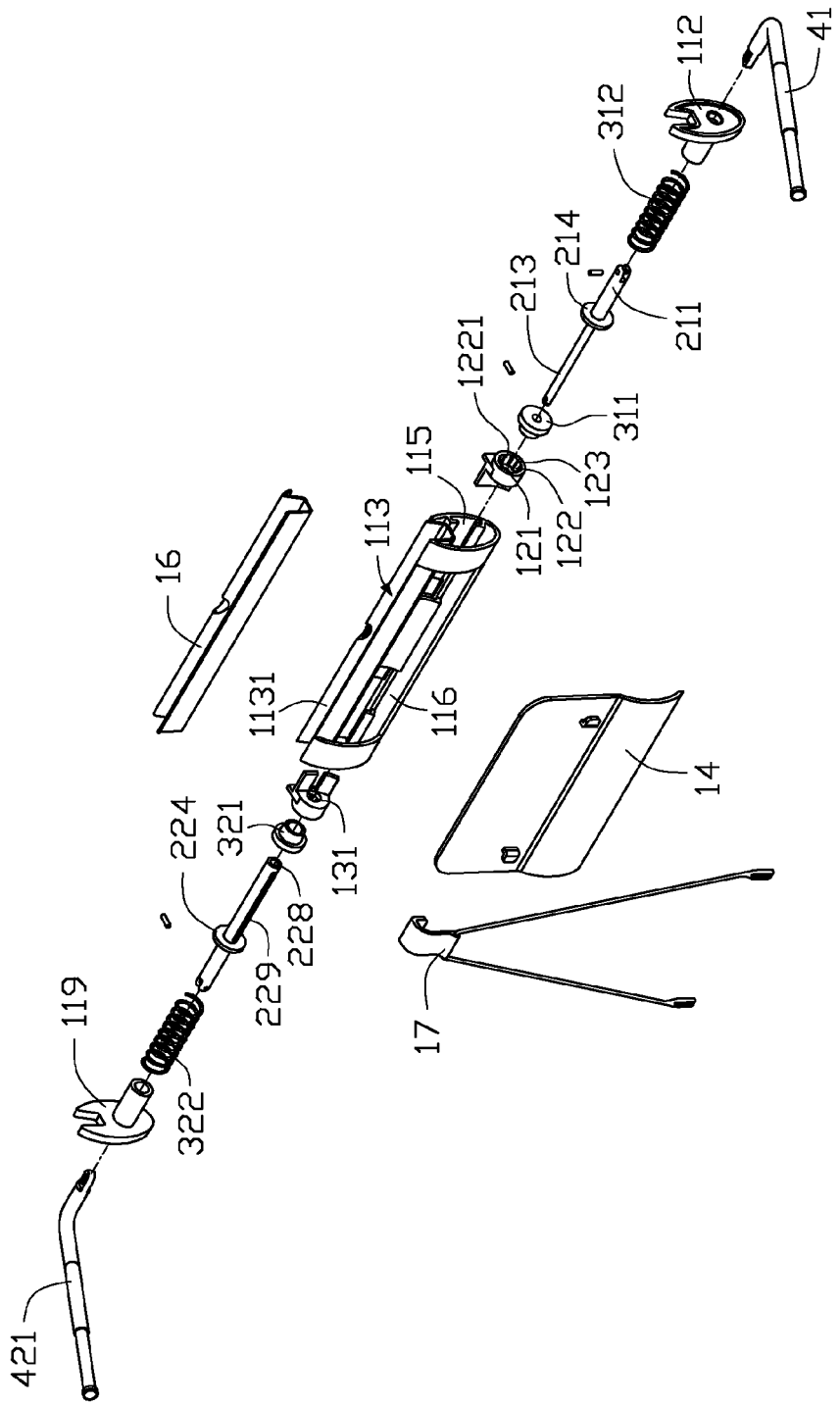
FIG. 4 is similar to FIG. 3, but viewed from another angle.

FIGS. 3-4 illustrate an embodiment of a detail of the support stand 1. In at least one example, the base 10 can include a housing 11 and a first limiting member 12. In at least one example, a shape of the housing 11 can be ellipse, round, or any other suitable shape. In at least one example, the housing 11 can include a main body 111 and a first cover 112. The main body 111 can define a receiving groove 113. The receiving groove 113 can be defined at a top of the main body 111 or any other suitable position of the main body 111. The receiving groove 113 can be configured to receive the electronic device 2. In at least one example, the receiving groove 113 can be configured to receive a bottom of the electronic device 2 or a side of the electronic device 2. In at least one example, the main body 111 can include a first end 114. The first end 114 of the main body 111 can define a first opening 115. The main body 111 can further include a first hollow portion 116. The first hollow portion 116 can be coupled to the first opening 115. The first cover 112 can be fixed to the first end 114 of the main body 111 at the first opening 115. In at least one example, the first cover 112 can be hooked to, or be threadedly connected to, or employ any other suitable mechanism to fix to the first end 114 of the main body 111. In at least one example, the first limiting member 12 can be fixed in the first hollow portion 116 of the main body 111. In at least one example, the first limiting member 12 can define a first through hole 121 and a first limiting groove 122. The first limiting groove 122 can surround the first through hole 121. In at least one example, the first limiting member 12 can define the first limiting groove 122 at an end facing the first cover 112.

In at least one example, the linkage bar 20 can be received in the first hollow portion 116. The linkage bar 20 can include a first shaft 21. The first shaft 21 can be movably arranged in the first hollow portion 116. In at least one example, the first shaft 21 can include a first shaft rod 211, a first positioning pin 212, a first connecting member 213, and a first resisting member 214. The first shaft rod 211 can be rotatably and movably connected to the supporting device 40. The first shaft rod 211 can include a first end 215 and a second end 216 opposite to the first end 215. A pair of lugs 217 (see FIG. 1) can protrude from the first end 215 of the first shaft rod 211. Two lugs 217 in the pair can be spaced from each other. The supporting device 40 can be received between the two lugs 217 in the pair. Each lug 217 can define a receiving hole 218 (see FIG. 1). The first positioning pin 212 can pass through the supporting device 40 and have two ends respectively received in an associated receiving hole 218. In at least one example, the first connecting member 213 can protrude from the second end 216 of the first shaft rod 211. The first connecting member 213 can pass through the first through hole 121. Thus, the first shaft 21 can be rotatably and slidably connected to the first limiting member 12. In at least one example, the first resisting member 214 can protrude from a peripheral surface of the first shaft rod 211.

Figure 5:
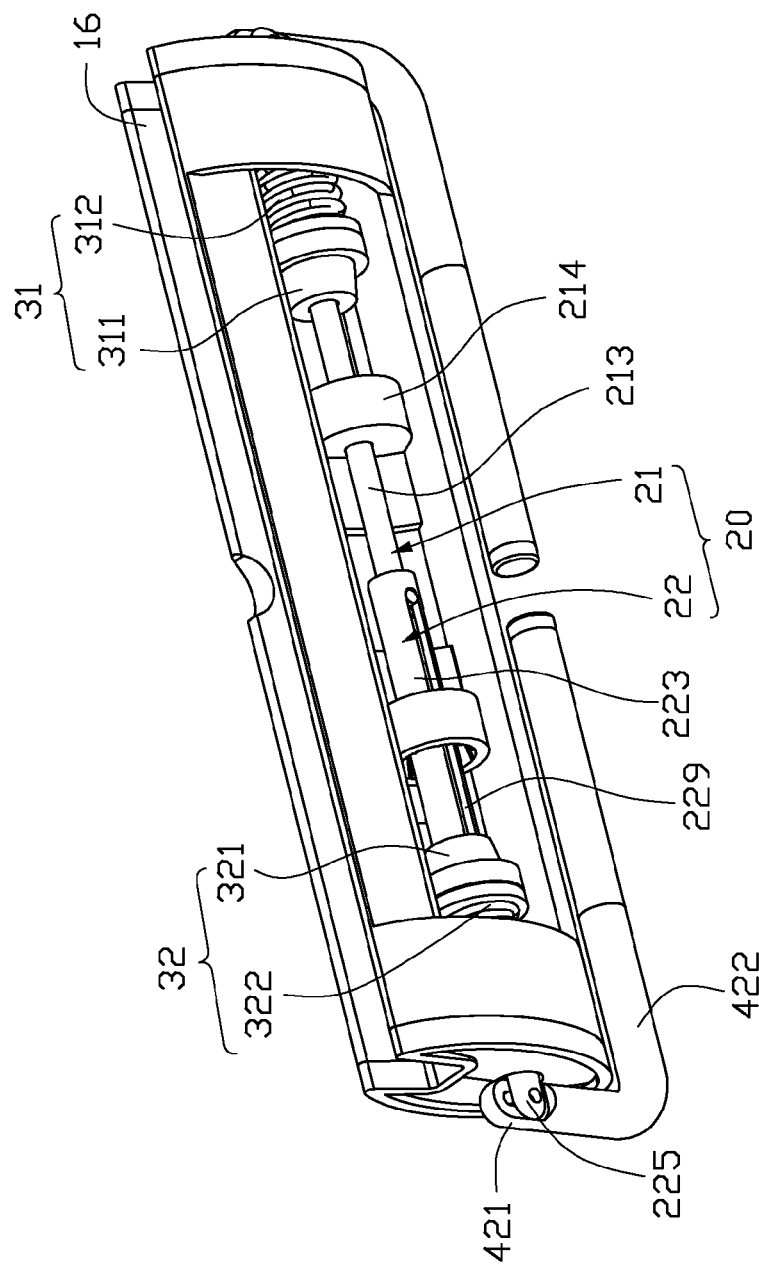
FIG. 5 is an isometric view of the support stand of FIG. 1 omitting a supporting plate and a latching device.

In at least one example, the positioning device 30 can include a first elastic positioning device 31 (see FIG. 5). In at least one example, the first elastic positioning device 31 can include a first washer 311 and a first elastic member 312. The first washer 311 can be fixed to the first connecting member 213. In at least one example, the first connecting member 213 can pass through the first washer 311 and the first through hole 121 in sequence. In at least one example, the first washer 311 can be made of elastic material. The first elastic member 312 can be pivoted on the first shaft rod 211 and be arranged between the first cover 112 and the first resisting member 214. In at least one example, the first elastic member 312 can have two opposite ends respectively resist the first cover 112 and the first resisting member 214. The first elastic member 312 can be configured to resile to bring the first shaft 21 away from the first cover 112.

In at least one example, the supporting device 40 can include a first supporting arm 41. In at least one example, the first supporting arm 41 can include a first connecting rod 411 and a first supporting rod 412. In at least one example, the first connecting rod 411 can be rotatably and slidably connected to the first shaft rod 211. The first connecting rod 411 can include a first end 413 and a second end 414 opposite to the first end 413. The first end 413 of the first connecting rod 411 can define a sliding slot 415. In at least one example, the first positioning pin 212 can pass through the sliding slot 415 and have the two ends respectively received in an associated receiving hole 218. The first positioning pin 212 can slide along the sliding slot 415 and rotate in the sliding slot 415. The second end 414 of the first connecting rod 411 can be fixed to the first supporting rod 412. In at least one example, the first supporting rod 412 can slope with respect to the first connecting rod 411. In at least one example, the first supporting rod 412 can be substantially perpendicular to the first connecting rod 411. The first supporting rod 412 can include a number of sleeved rods 416. Thus, a length of the first supporting rod 412 can be adjusted via adjusting positions of one or more rods 416 with respect to the other rods 416. The first supporting rod 412 can be configured to support the base 10 and the electronic device 2. In an initial state, the first connecting rod 411 can be substantially perpendicular to the first shaft rod 211, and resist the first cover 112 (see FIG. 5).

To support the electronic device 2, the first supporting arm 41 can be exerted to cause the first positioning pin 212 to rotate and slide in the sliding slot 415 until the first connecting rod 411 is substantially parallel with the first shaft 21. The first elastic member 312 can resile to bring the first shaft 21 away from the first cover 112; the first shaft 21 can bring the first connecting rod 411 into the first hollow portion 116, and bring the first washer 311 toward the first limiting member 12. The first limiting groove 122 can exert a force on the first washer 311, causing the first washer 311 to be deformed. The first washer 311 can resile to resist the first limiting groove 122, thus the first washer 311 can be limited in the first limiting groove 122. The first shaft 21 and the first connecting rod 411 can be positioned relative to the base 10. The first supporting rod 412 can form the desired angle with the base 10 and be positioned at the desired angle. Thus, the first supporting rod 412 can cooperate with the base 10 to support the base 10 and the electronic device 2 (see FIG. 6).

To adjust the angle formed between the first supporting rod 412 and the base 10, the first supporting rod 412 can be exerted to bring the first shaft 21 toward the first cover 112. The first shaft 21 can bring the first washer 311 away from the first limiting groove 122, and the first resisting member 214 can compress the first elastic member 312. Here, the first supporting rod 412 can be rotated to adjust the angle formed between the first supporting rod 412 and the base 10. When the force exerted on the first supporting rod 412 is abated, the first elastic member 312 can perform the aforementioned movement with the first shaft 21, and the first connecting rod 411 and the first washer 311 can accordingly perform the aforementioned movement. Thus, the first shaft 21 and the first connecting rod 411 can be repositioned relative to the base 10, and the angle formed between the first supporting rod 412 and the base 10 can be adjusted, such as from tilting forward 60 degrees to tilting backward 60 degrees, or from tilting forward 60 degrees to tilting forward 45 degrees.

In at least one example, to adjust the angle formed between the first supporting rod 412 and the base 10 in a tilting forward state or in a tilting backward state, rather than adjusting between the tilting forward state and the tilting backward state, the positions of the one or more rods 416 with respect to the other rods 416 can be adjusted. Thus, the length of the first supporting rod 412 can be adjusted, and the angle formed between the first supporting rod 412 and the base 10 can be accordingly adjusted.

In at least one example, a number of ribs 123 can protrude from a sidewall 1221 of the first limiting groove 122. The ribs 123 can be configured to exert a force to the first washer 311, whereby the first washer 311 is deformed. The first washer 311 can be configured to resile to resist the ribs, thus the first washer 311 can be firmly limited in the first limiting groove 122.

In at least one example, the main body 111 can further include a second end 117 opposite to the first end 114. The second end 117 of the main body 111 can define a second opening 118. The second opening 118 can be coupled to the first hollow portion 116. The housing 11 can further include a second cover 119. The second cover 119 can be fixed to the second end 117 of the main body 111 at the second opening 118. The base 10 can further include a second limiting member 13. The second limiting member 13 can be fixed in the first hollow portion 116 of the main body 111 and be spaced apart from the first limiting member 12. In at least one example, the second limiting member 13 can define a second through hole 131 and a second limiting groove 132. The second limiting groove 132 can surround the second through hole 131. In at least one example, the second limiting member 13 can define the second limiting groove 132 at an end facing the second cover 119.

In at least one example, the first connecting member 213 can define a limiting hole 219. In at least one example, the linkage bar 20 can further include a second shaft 22. The first shaft 21 and the second shaft 22 can extend through the first hollow portion 116. The second shaft 22 can be slidably connected to the first shaft 21. In at least one example, the second shaft 22 can include a second shaft rod 221, a second positioning pin 222, a second connecting member 223, and a second resisting member 224. The second shaft rod 221 can be rotatably and slidably connected to the supporting device 40. The second shaft rod 221 can include a first end 225 and a second end 226 opposite to the first end 225. The first end 225 of the second shaft rod 221 can pass through the second cover 119 to be exterior to the first hollow portion 116. In at least one example, a structure of the second shaft rod 221 can be similar to a structure of the first shaft rod 211. Thus, a detail description of the second shaft rod 221 is omitted herein.

In at least one example, the second connecting member 223 can protrude from the second end 226 of the second shaft rod 221. The second connecting member 223 can pass through the second through hole 131. Thus, the second connecting member 223 can be rotatably connected to the second limiting member 13. In at least one example, an end of the second connecting member 223 away from the second shaft rod 221 with respect to the second resisting member 224 can define a receiving opening 227. The second connecting member 223 can further define a second hollow portion 228. The second hollow portion 228 can be coupled to the receiving opening 227. The first connecting member 213 can be received in the second hollow portion 228 via the receiving opening 227. The second connecting member 223 can define at least one guiding slot 229. In at least one example, two guiding slots 229 can be taken as an example. Each guiding slot 229 can be coupled to the second hollow portion 228. The second positioning pin 222 can pass through the limiting hole 219 and have two ends respectively received in an associated guiding slot 229. The second positioning pin 222 can slide along the guiding slots 229. Thus, the first connecting member 213 can be slidably connected to the second connecting member 223. In at least one example, the second resisting member 224 can protrude from a peripheral surface of the second shaft rod 221.

In at least one example, the positioning device 30 can further include a second elastic positioning device 32. In at least one example, the second elastic positioning device 32 can include a second washer 321 and a second elastic member 322. In at least one example, a detail structure of the second elastic positioning device 32 can be similar to a detail structure of the first elastic positioning device 31, and a relation between the second elastic positioning device 32 and the second shaft 22 and a relation between the second elastic positioning device 32 and the second limiting member 13 can be respectively similar to a relation between the first elastic positioning device 31 and the first shaft 21 and a relation between the first elastic positioning device 31 and the first limiting member 12. Thus, a detail description of the second washer 321 of the second elastic positioning device 32 and the second elastic member 322 of the second elastic positioning device 32 is omitted herein.

In at least one example, the supporting device 40 can further include a second supporting arm 42. The second supporting arm 42 can be rotatably and slidably connected to the second shaft rod 221. The second supporting arm 42 can include a second connecting rod 421 and a second supporting rod 422. In at least one example, a detail structure of the second supporting arm 42 can be similar to a detail structure of the first supporting arm 41, and a relation between the second supporting arm 42 and the second shaft rod 221 can be similar to a relation between the first supporting arm 41 and the first shaft rod 211. Thus, a detail description of the second connecting rod 421 of the second supporting arm 42 and the second supporting rod 422 of the second supporting arm 42 can be omitted herein.

The second supporting arm 42 can be exerted to cause the second connecting rod 421 to be substantially parallel with the second shaft 22. The second elastic member 322 can resile to bring the second shaft 22 away from the second cover 119 and to move in a direction opposite to a movement direction of the first shaft 21. The second shaft 22 can bring the second connecting rod 421 into the first hollow portion 116, and bring the second washer 321 toward the second limiting member 13. The second limiting groove 132 can exert a force to the second washer 321, whereby the second washer 321 is deformed. The second washer 321 can resile to resist the second limiting groove 132, thereby the second washer 321 can be limited in the second limiting groove 132. The second shaft 22 and the second connecting rod 421 can be positioned relative to the base 10. The second supporting rod 422 can form the desired angle with the base 10. Thus, the second supporting rod 422 can cooperate with the first supporting rod 412 and the base 10 to support the base 10 and the electronic device 2.

In at least one example, the base 10 can further include a supporting plate 14. In at least one example, the supporting plate 14 can be fixed to the housing 11, and extend out along an inner sidewall 1131 of the receiving groove 113. The supporting plate 14 can be configured to resist the electronic device 2 to support the electronic device 2.

In at least one example, the supporting plate 14 further includes an inner surface 141 extending along the inner sidewall 1131 of the receiving groove 113. The base 10 can further include an anti-slip strip 15. In at least one example, the anti-slip strip 15 can be made of silicone material, rubber material, or any other suitable material. The anti-slip strip 15 can be fixed to the inner surface 141 of the supporting plate 14. The anti-slip strip 15 can be configured to increase friction between the supporting plate 14 and the electronic device 2, whereby the electronic device 2 is prevented from moving relative to the supporting plate 14.

In at least one example, the base 10 can further include an anti-scratch film 16. In at least one example, the anti-scratch film 16 can be made of plastic material, or any other suitable material. In at least one example, the anti-scratch film 16 can be fixed in the receiving groove 113 and can be configured to protect the electronic device 2 from being scratched when the electronic device 2 is received in the receiving groove 113.

In at least one example, the base 10 can further include a latching device 17. The latching device 17 can include an elastic member 171 and a hook 172. In at least one example, two opposite ends of the elastic member 171 can be fixed to the base 10. The elastic member 171 can be configured to resile to bring the hook 172 toward the base 10. The hook 172 can be fixed to the elastic member 171. In at least one example, the hook 172 can be fixed to a substantially middle of the elastic member 171. The hook 172 can include a first end 173 and a second end 174 opposite to the first end 173. The second end 174 of the hook 172 can bend toward the first end 173 of the hook 172. The hook 172 can be configured to hook the electronic device 2 to fix the electronic device 2 to the base 10, whereby the electronic device 2 is prevented from disengaging from the receiving groove 113 when the electronic device 2 tilts forward.

The embodiments shown and described above are only examples. Even though numerous characteristics and advantages of the present technology have been set forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims.

What is claimed is:

1. A support stand comprising:
a housing defining a receiving groove and a first hollow portion, wherein the receiving groove is configured to receive an electronic device;
a first limiting member fixed in the first hollow portion and defining a first limiting groove;
a linkage bar movably received in the first hollow portion, wherein the linkage bar comprises a first shaft, the first shaft passes through the housing to be exterior to the housing;
a first elastic positioning device movably received in the first hollow portion and configured to be partially deformed by the first limiting groove and to partially resist and limit the first limiting groove, thereby the linkage bar being fixed to the housing, wherein the first elastic positioning device comprises a first washer and a first elastic member, the first washer is fixed to the first shaft, the first washer is configured to be deformed by the first limiting groove and to resist and limit the first limiting groove, the first elastic member is arranged between the housing and the first shaft, the first elastic member is configured to resile to bring the first shaft away from the housing; and
a first supporting arm slidably and rotatably connected to the linkage bar and configured to be positioned relative to the housing when the linkage bar is fixed to the housing and partially exterior to the housing to form a desired angle with the housing, whereby the first supporting arm cooperates with the housing to support the housing and the electronic device.

2. The support stand as described in claim 1, wherein the first shaft is configured to bring the first washer toward the first limiting member when the first elastic member resiles to bring the first shaft away from the housing.

3. The support stand as described in claim 2, wherein:
the first limiting member defines a first through hole, the first limiting groove surrounds the first through hole, the first shaft passes through the first through hole.

4. The support stand as described in claim 2, wherein:
the first supporting arm comprises a first connecting rod and a first supporting rod;
the first connecting rod is rotatably and slidably connected to the first shaft, the first connecting rod is configured to be brought by the first shaft into the first hollow portion, and the first connecting rod is configured to be positioned relative to the housing when the first washer limit the first limiting groove; and
the first supporting rod is fixed to the first connecting rod, and slopes with respect to the first connecting rod, the first supporting rod is exterior of the housing, the first supporting rod is configured to form the desired angle with the housing and cooperate with the housing to support the housing and the electronic device.

5. The support stand as described in claim 4, wherein:
the first shaft comprises a first shaft rod, a first connecting member, and a first resisting member;
the first shaft rod is rotatably and slidably connected to the first connecting rod;
the first connecting member protrudes from an end of the first shaft rod, and passes through the first washer to cause the first washer to be fixed to the first connecting member; and the first resisting member protrudes from a peripheral surface of the first shaft rod, the first elastic member is arranged between the housing and the first resisting member.

6. The support stand as described in claim 5, wherein:
the housing comprises a main body and a first cover, the first cover is fixed to the main body, the first shaft passes through the first cover, the first elastic member is arranged between the first cover and the first resisting member, the first elastic member is configured to resile to bring the first shaft away from the first cover.

7. The support stand as described in claim 4, wherein:
the first shaft further comprises a first positioning pin, a pair of lugs protrudes from a first end of the first shaft, two lugs in the pair are spaced from each other, each of the lugs defines a receiving hole;
an end of the first connecting rod defines a sliding slot, the end of the first connecting rod is received between the two lugs in the pair;
the first positioning pin passes through the sliding slot and has two ends respectively received in an associated receiving hole; and
the first positioning pin is slidably and rotatably received in the sliding slot.

8. The support stand as described in claim 4, wherein:
the first supporting rod comprises a plurality of sleeved rods, a length of the first supporting rod is adjustable via adjusting positions of one or more rods of the first supporting rod with respect to the other rods of the first supporting rod.

9. The support stand as described in claim 4, further comprising:
a second limiting member fixed in the first hollow portion of the housing and spacing from the first limiting member, the second limiting member defining a second limiting groove;
a second elastic positioning device movably received in the first hollow portion and configured to be partially deformed by the second limiting groove and to partially resist and limit the second limiting groove, thereby the linkage bar being fixed to the housing; and
a second supporting arm slidably and rotatably connected to the linkage bar and configured to be positioned relative to the housing when the linkage bar is fixed to the housing, and partially exterior to the housing to form the desired angle with the housing, whereby the second supporting arm cooperates with the first supporting arm and the housing to support the housing and the electronic device.

10. The support stand as described in claim 9, wherein:
the linkage bar further comprises a second shaft, the first shaft and the second shaft extend through the first hollow portion, the second shaft is movably received in the first hollow portion, the second shaft is slidably connected to the first shaft and passes through the housing to be exterior to the housing; and
the second elastic positioning device comprises a second washer and a second elastic member, the second washer is fixed to the second shaft, the second washer is configured to be deformed by the second limiting groove and resist and limit the second limiting groove, the second elastic member is arranged between the housing and the second shaft, the second elastic member is configured to resile to bring the second shaft to move in a direction opposite to a movement direction of the first shaft;

wherein the second shaft is configured to bring the second washer toward the second limiting member when the second elastic member resiles to bring the second shaft away from the housing.

11. The support stand as described in claim 10, wherein:
the second supporting arm comprises a second connecting rod and a second supporting rod;
the second connecting rod is rotatably and slidably connected to the second shaft, the second connecting rod is configured to be brought by the second shaft into the first hollow portion, and the second connecting rod is configured to be positioned relative to the housing when the second washer limits the second limiting groove; and
the second supporting rod is fixed to the second connecting rod, and slopes with respect to the second connecting rod, the second supporting rod is exterior of the housing, the second supporting rod is configured to form the desired angle with the housing and cooperate with the first supporting rod and the housing to support the housing and the electronic device.

12. The support stand as described in claim 10, wherein:
an end of the second shaft defines a receiving opening and the second shaft defines a second hollow portion, the second hollow portion is coupled to the receiving opening, the second shaft further defines at least one guiding slot, the at least one guiding slot is coupled to the second hollow portion, the second shaft further comprises a second positioning pin; and
a second end of the first shaft defines a limiting hole, the second end of the first shaft is received in the second hollow portion via the receiving opening;
wherein the second positioning pin passes through the limiting hole and has at least one end received in the at least one guiding slot.

13. The support stand as described in claim 2, wherein:
a sidewall of the first limiting groove protrudes a plurality of ribs, the plurality of ribs are configured to exert a force to the first washer, causing the first washer to be deformed, the first washer is configured to resist the plurality of ribs, thus being limited in the first limiting groove.

14. The support stand as described in claim 1, further comprising a supporting plate, wherein:
the supporting plate is fixed to the housing and extend out along an inner sidewall of the receiving groove, the supporting plate is configured to resist the electronic device to support the electronic device.

15. The support stand as described in claim 14, wherein:
the supporting plate comprises an inner surface extending along an inner sidewall of the receiving groove, the support stand further comprises an anti-slip strip, the anti-slip strip is fixed to the inner surface of the supporting plate, the anti-slip strip is configured to increase a friction between the supporting plate and the electronic device, whereby the electronic device is prevented from moving relative to the supporting plate.

16. The support stand as described in claim 1, further comprising an anti-scratch film, wherein:
the anti-scratch film is fixed in the receiving groove, the anti-scratch film is configured to protect the electronic device from a scratch when the electronic device is received in the receiving groove.

17. The support stand as described in claim 1, further comprising a latching device, wherein:
the latching device comprises an elastic member and a hook;
two opposite ends of the elastic member are fixed to the housing, the elastic member is configured to resile to bring the hook toward the housing; and
the hook is fixed to the elastic member, the hook comprises a first end and a second end opposite to the first end, the second end of the hook bends toward the first end of the hook, the hook is configured to hook the electronic device to fix the electronic device to the housing, whereby the electronic device is prevented from disengaging from the receiving groove when the electronic device tilts forward.

* * * * *